United States Patent
Tesson (10) Patent No.: US 12,170,512 B2
(45) Date of Patent: Dec. 17, 2024

(54) PASSIVE PHASE SHIFTER FOR W BAND OPERATION BASED ON SLOW-WAVE TLINES

(71) Applicant: NXP B.V., Eindhoven (NL)

(72) Inventor: Olivier Tesson, Bretteville l'Orgueilleuse (FR)

(73) Assignee: NXP B.V., Eindhoven (NL)

( * ) Notice: Subject to any disclaimer, the term of this patent is extended or adjusted under 35 U.S.C. 154(b) by 258 days.

(21) Appl. No.: 17/819,794

(22) Filed: Aug. 15, 2022

(65) Prior Publication Data

US 2023/0083719 A1  Mar. 16, 2023

(30) Foreign Application Priority Data

Sep. 16, 2021  (EP) ..................... 21306278

(51) Int. Cl.
| | |
|---|---|
| *H03H 7/20* | (2006.01) |
| *H01Q 1/52* | (2006.01) |
| *H01Q 3/30* | (2006.01) |
| *H03H 17/08* | (2006.01) |
| *H01P 1/18* | (2006.01) |

(52) U.S. Cl.
CPC .............. *H03H 7/20* (2013.01); *H01Q 1/526* (2013.01); *H01Q 3/30* (2013.01); *H03H 17/08* (2013.01); *H01P 1/184* (2013.01)

(58) Field of Classification Search
CPC .......... H01Q 3/30; H01Q 1/526; H03H 17/08; H03H 7/20; H01P 1/184
See application file for complete search history.

(56) References Cited

U.S. PATENT DOCUMENTS

| 2020/0118781 | A1  | 4/2020 | Wang et al. |
| 2020/0203827 | A1* | 6/2020 | Wang ...................... H01P 1/181 |
| 2021/0135656 | A1* | 5/2021 | Birkbeck ................. H03H 7/20 |
| 2022/0200577 | A1* | 6/2022 | Azizi ................... H04L 27/0002 |

FOREIGN PATENT DOCUMENTS

NZ      515514 A     8/2003

OTHER PUBLICATIONS

Tousi, Y., "A Ka-band Digitally-Controlled Phase Shifter with sub-degree Phase Precision", 2016 IEEE Radio Frequency Integrated Circuits Symposium (RFIC), May 22-24, 2016.
Tsai, M., "60GHz Passive and Active RF-path Phase Shifters in Silicon", 2009 IEEE Radio Frequency Integrated Circuits Symposium (RFIC), Jun. 7-9, 2009.
Woods, W., "CMOS Millimeter Wave Phase Shifter Based on Tunable Transmission Lines", Proceedings of the IEEE 2013 Custom Integrated Circuits Conference, Sep. 22-25, 2013.

* cited by examiner

*Primary Examiner* — Quan Tra (57) ABSTRACT

An embodiment of passive phase shifter comprises a ground shield, a pair of ground walls electrically connected to the ground shield having a first height above the ground shield; and a signal line positioned between the ground walls and electrically isolated from the ground shield. The signal line may comprise an intermediate signal line separated a second height above the ground shield; a top signal line separated from the intermediate signal line at a third height above the ground shield and electrically connected to the intermediate signal line by one or more conductive vias; and a plurality of blocks positioned between and electrically isolated from the intermediate signal line and the top signal line.

20 Claims, 11 Drawing Sheets

PASSIVE PHASE SHIFTER FOR W BAND OPERATION BASED ON SLOW-WAVE TLINES

CROSS-REFERENCE TO RELATED APPLICATIONS

This application claims the priority under 35 U.S.C. § 119 of European Patent application no. 21306278.9, filed on 16 Sep. 2021, the contents of which are incorporated by reference herein.

FIELD

The present disclosure relates to a phase shifter, specifically to a passive phase shifter for W band operation based on slow-wave Tlines. In particular, the phase shifter is suitable for millimetre wave operations in the W band.

BACKGROUND

Phase shifters are components which can be found in electronic beam scanning phased arrays and radars. Phase shift modules are network modules which provide control over phase shift, typically of a radio frequency (RF) signals and are commonly used in phase shift arrays. Active phase shifters provide gain, whilst passive phase shifters are lossy.

SUMMARY

According to an aspect, there is provided a device according to claim 1. Further features according to embodiments are set out in the dependent claims.

According to a first aspect, there is provided a passive phase shifter. The passive phase shifter may comprise a ground shield, a pair of ground walls electrically connected to the ground shield having a first height above the ground shield; and a signal line positioned between the ground walls and electrically isolated from the ground shield. The signal line may comprise an intermediate signal line separated a second height above the ground shield; a top signal line separated from the intermediate signal line at a third height above the ground shield and electrically connected to the intermediate signal line by one or more conductive vias; and a plurality of blocks positioned between and electrically isolated from the intermediate signal line and the top signal line.

In some embodiments, the ground shield, ground walls, signal line and blocks comprise patterned metal features in a metallisation stack.

A signal line comprising an intermediate signal line and a top signal line connected by one or more conductive vias beneficially doubles the signal along the transmission line. This design targets the characteristic impedance of the device. Advantageously, providing a plurality of blocks between and isolated from the intermediate and top signal lines creates a device whereby the phase shift of a signal can be tuned according to requirements. Furthermore, the phase shift can be controlled according to the number of blocks in the plurality of blocks.

In some embodiments, a first and a second block of the plurality of blocks may be electrically coupled in a first pair. The first block is optionally adjacent to the second block. Electrically coupling pairs of blocks, in particular adjacent pairs of blocks, helps to minimise the connections present in the device which may help to reduce losses.

In some embodiments, the first pair of blocks is electrically connectable to a second pair of blocks by a first switch, the second pair of blocks comprising a third block and a fourth block of the plurality of blocks. Electrically addressing the blocks individually by virtue of the switch allows the phase shift of the signal to be tuned by adding or removing blocks from the signal path. The greater the number of blocks which are turned on by the switch, the greater the phase shift of the signal in use.

In some embodiments, the third block is optionally adjacent to the fourth block. The first pair of blocks is optionally adjacent to the second pair of blocks. Electrically coupling pairs of blocks, in particular adjacent pairs of blocks, helps to minimise the connections present in the device which may help to reduce losses.

In some embodiments, the first and second pairs of blocks may be coupled to the ground shield when the first switch is on.

In some embodiments, the first switch can be positioned between the signal line and a first one of the pair of ground walls at the second height. Positioning the switch outside of the signal path and the return path of the signal helps to reduce losses.

The passive phase shifter optionally further comprising a third pair of blocks and fourth pair of blocks electrically connectable by a second switch, the second switch positioned between the signal line and a second one of the pair of ground walls at the second height. The phase shift can be further tuned by adding more blocks, controllable by further switches.

In some embodiments, the passive phase shifter may further comprise one or more additional passive phase shifters connected in parallel. Another way of providing a phase shift to a signal is to connect a plurality of phase shifters in parallel. Preferably wherein the phase shifters are linear.

Optionally, further comprising switches for controlling the plurality of phase shifters, wherein the switches are connected to ends of the signal lines. To tune the plurality of parallel phase shifters to adjust the phase shift to a desirable amount, each phase shifter can be addressed individually. The greater the number of phase shifters turned on by the switch, the greater the phase shift.

In some embodiments, adjacent blocks in the plurality of blocks are spaced apart from one another by a first distance. This distance electrically isolates adjacent blocks from one another. This in turn allows them to be individually addressed.

In some embodiments, the plurality of blocks are arranged in a linear array along a longitudinal axis of the signal line. This configuration is convenient in applications such as radar and communications systems.

In some embodiments, the ground shield may comprise a plurality of elongate slots extending perpendicular to a longitudinal axis of the signal line. Compared to a standard coplanar line, a patterned ground shield comprising a plurality of elongate slots has a so called "slow-wave effect" which helps to slow down the phase velocity of the signal and boosts the capacitance as well as the inductive contribution whilst maintaining the same characteristic impedance of the device. This therefore provides a way to minimise the overall device size.

According to a second aspect, there is provided a method of manufacturing a passive phase shifter using a metallisation process. The metallisation process comprising forming a ground shield; forming a pair of ground walls electrically connected to the ground shield, the ground walls having a first height above the ground shield; and forming a signal line positioned between the ground walls and electrically isolated from the ground shield. The signal line may comprise an intermediate signal line separated a second height above the ground shield; a top signal line separated from the intermediate signal line at a third above the ground shield and electrically connected to the intermediate signal line by one or more conductive vias. The signal line may further comprise a plurality of blocks positioned between and electrically isolated from the intermediate signal line and the top signal line.

The passive phase shifter manufactured according to a metallisation process ensures controllability of the design and can offer high precision.

BRIEF DESCRIPTION OF DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Phased array systems are used widely in mm wave communications such as radar and long communication range applications. They are useful because they can minimize power consumption. Adjusting the phase of a signal, such as in an antenna application, can be important in achieving adaptive beam steering.

Miniaturisation of phase shifters in particular can be beneficial for applications of phased array systems. A slow-wave transmission line has been known to help miniaturisation of transmission lines for phase shifters. Standard slow-wave transmission lines can be easy to design and manufacture, and have the ability to get accurate, well defined characteristic impedance with low spread, in particular when manufactured using a metallisation process. The characteristic impedance of a uniform transmission line is the ratio of the amplitudes of voltage and current of a single wave propagating along the line; that is, a wave travelling in one direction in the absence of reflections in the other direction. Characteristic impedance is determined by the geometry and materials of the transmission line and, for a uniform line, is not dependent on its length. The SI unit of characteristic impedance is the ohm. The characteristic impedance of a lossless transmission line is purely real, with no reactive component. Energy supplied by a source at one end of such a line is transmitted through the line without being dissipated in the line itself. A transmission line of finite length (lossless or lossy) that is terminated at one end with an impedance equal to the characteristic impedance appears to the source like an infinitely long transmission line and produces no reflections.

Slow-wave transmission lines can be implemented at wavelengths in the W band to reduce component size, which is desirable in many of the applications of phased array systems. By varying the per unit length capacitance of a section of the transmission line, the delay time of the transmission line can be varied and optimised so as to reduce the overall device size. Other important factors that need to be considered in designing slow-wave transmission lines are maintaining or improving the quality factor by reducing losses.

The design of the passive phase shifter 100 described herein is particularly useful for millimetre wave operations in the W band, operating at high frequencies between 60 and 120 Hz based on boosted slow wave T-line. Phase shift can be defined as the difference in phase between an input signal, for example at one end of the phase shifter, and an output signal, for example at the other end of the phase shifter.

Figure 1A:
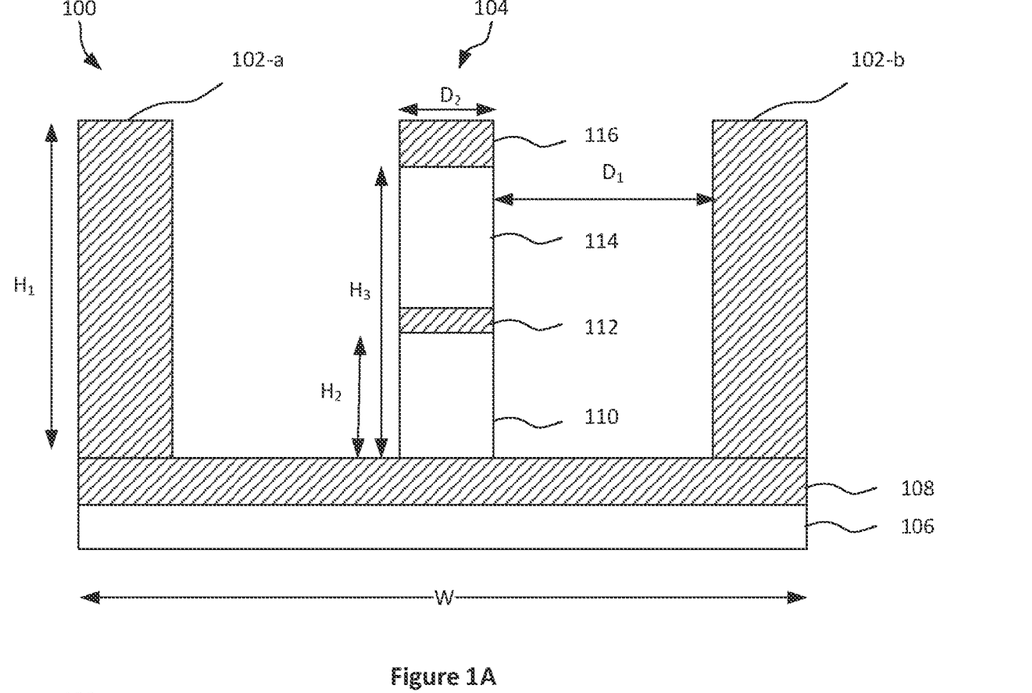
FIGS. 1A and 1B illustrate cross-sectional views of a phase shifter according to an embodiment of the disclosure.
Figure 1B:
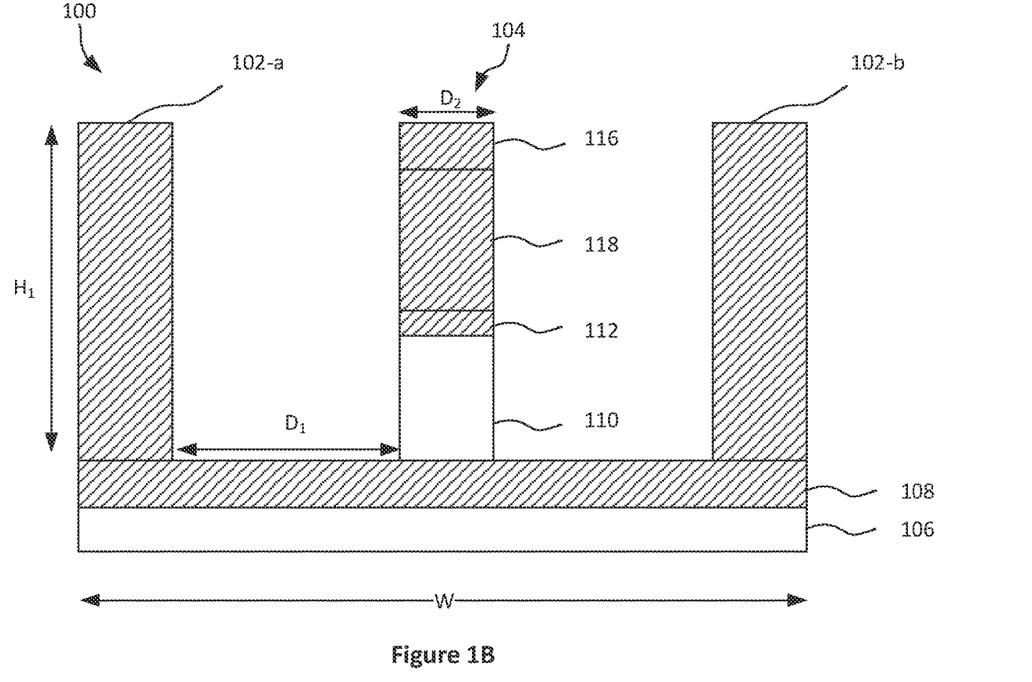
Figure 2:
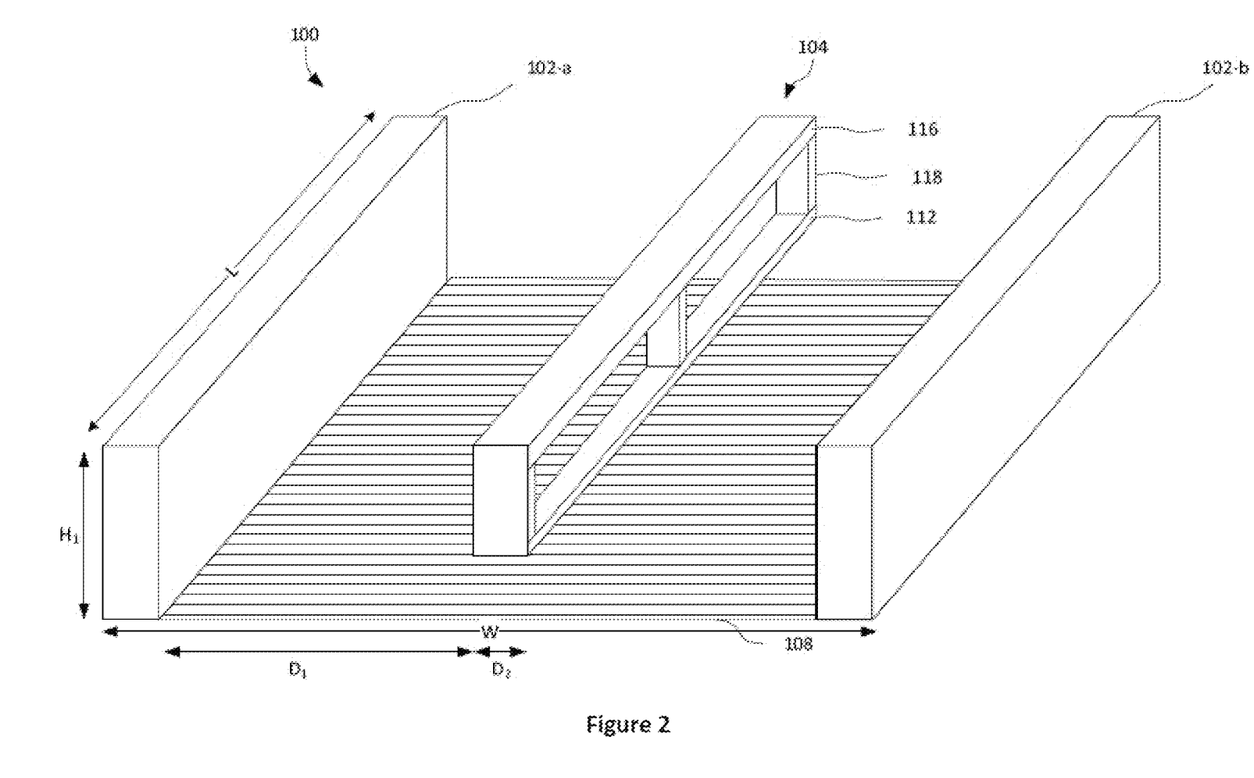
FIG. 2 illustrates a perspective view of the phase shifter according to an embodiment of the disclosure.

FIGS. 1A and 1B illustrate cross-sectional views of a phase shifter 100 and FIG. 2 illustrates a perspective view of the phase shifter 100. FIGS. 1A, 1B and 2 will be described together below. FIG. 1A illustrates a cross-sectional view through a section of the phase shifter 100 where the intermediate and top signal lines 112, 116 are separated from one another and FIG. 1B illustrates a cross-sectional view through a section of the phase shifter where the intermediate and top signal lines 112, 116 are connected by via 118. Areas of the device which are metallic are shaded, whilst non-shaded areas show regions of dielectric material. It will be appreciated that the Figures are provided for ease of understanding of the device and that the dimensions are not to scale.

The bottom-most layer of the phase shifter 100 comprises a metal shield, also called a ground shield 108 on an insulating layer 106 and extends the full width W and length L of the device. The insulating layer comprises an insulating material, such as silicon dioxide or a substrate such as a PCB. In some embodiments, the ground shield 108 can be patterned, for example with a slotted metal pattern in a direction parallel to the width W of the phase shifter 100, i.e. metal slots extend between the ground walls 102-a, 102-b orthogonal to the length L. Compared to a standard coplanar line, a patterned ground shield 108 has a so called "slow-wave effect" which helps to slow down the phase velocity of the signal and boosts the capacitance as well as the inductive contribution whilst maintaining the same characteristic impedance of the device. The magnetic field passes through the spaces between the patterned metal, leading to an inductance per length that is unchanged compared to a non-patterned ground shield. The electric field lines, however, end at the patterned metal and the electric field is concentrated between the patterned ground shield 108 and the ground walls 102-a, 102-b. The capacitance per length is increased by this effect, so for the same geometric length, a greater electrical length can be achieved. This therefore provides a way to minimise the overall device size.

Deposited on top of and connected to the ground shield 108 along the edges of the phase shifter 100 are two lateral ground walls 102-a, 102-b. The ground walls 102-a, 102-b surround a central signal line 104. The ground walls 102-a, 102-b and central signal line 104 extend a length L of the phase shifter 100. The top of the ground walls 102-a, 102-b and central signal line 104 have a top surface positioned at the same height away from the metal shield 108 which forms the bottom surface of the phase shifter 100.

Lateral ground walls 102-a, 102-b are separated a distance $D_1$ away from the central signal line 104. $D_1$ is symmetrical about the centre of the phase shifter 100 such that the distance between a first of the ground walls 102-a and the signal line 104, and the distance between a second of the ground walls 102-b and the signal line 104 is the same.

The ground walls 102-a, 102-b extend along the length L of the phase shifter 100 as a metal stack from the bottom surface to the top surface by a height $H_1$. Each of the ground walls 102-a, 102-b extends upwards in a direction $H_1$, orthogonal to the ground shield 108. The ground walls 102-a, 102-b being made of a full metal stack and in direct contact with the ground shield 108 ensures that the return path of a signal is made therethrough, independent of signal line configuration.

A signal line 104, for example a transmission line, extends the length L of the phase shifter 100, parallel to the ground wall 102-a, 102-b. The intermediate and top signal lines 112, 116 are made of a conductive material such as metal. An intermediate signal line 112, one or more vias 118, and a top signal line 116 make up the structure of the central signal line 104. The intermediate and top signal lines 112, 116 are parallel to one another and extend in a plane parallel to the ground shield 108 along the length L of the phase shifter 100 in the direction that a signal travels in use. The signal line 104 has a width of distance $D_2$ along the width W of the phase shifter 100. $D_2$ is less than $D_1$. The gap $D_1$ between the signal line 104 and ground walls 102-a, 102-b defines characteristic impedance of the phase shifter 100. Changing gap dimensions means that the impedance of the phase shifter can be tuned. Prior art devices have been designed to maintain an impedance of the phase shifter at 50 Ohms. However, the present disclosure can operate between 40 Ohms and 60 Ohms.

Conductive vias 118 connect the intermediate signal line 112 to the top signal line 116 which are separated a height $H_3-H_2$ from one another. Conductive vias 118 are positioned at constant intervals along the length L of the phase shifter 100, perpendicular to the intermediate and top signal lines 112, 116 as illustrated in FIG. 2.

The signal line 104, specifically the intermediate signal line 112, is positioned a height $H_2$ above the ground shield 108 such that the signal line 104 is electrically isolated from the ground shield 108. Dielectric layer 110 separates the intermediate signal line 112 from the ground shield 108 to achieve this electrical isolation. The signal along the signal line 104 is doubled by the separation between the top signal line 116 and intermediate signal line 112 connected by the conductive vias 118. The capacitive contribution of the signal line 104 to the ground shield 108 is primarily driven by the intermediate signal line 112, which is closer to the ground shield 108.

Although not shown in the figure, the signal line is connected to a signal input and output at each end of the phase shifter 100, for example an amplifier, configured to send an electrical signal along the signal line 104.

In operation of the phase shifter 100, a signal, for example an electromagnetic signal, propagates along the signal line 104. This generates an electric and magnetic field about the signal line 104. The electric field terminates at the ground walls 102-a, 102-b and the ground shield 108. A return ground current flows through the ground walls 102-a, 102-b.

The ground shield 108 prevents the electric field created by a signal flowing along the signal line from entering the substrate 106. The patterned ground shield 108 slows down phase velocity of returning current compared to a non-patterned ground shield 108. Permittivity is also boosted by metal patterning. Comparing patterned versus non-patterned ground shields, the same characteristic impedance can be achieved with a patterned ground shield which is a shorter length than a non-patterned ground shield. As such, a phase shifter 100 implementing a patterned ground shield can be smaller than one without. This is beneficial for space saving when implemented.

As the signal propagates, a phase shift is induced in the signal by delaying the velocity of the signal according to the geometry of the signal line 104. Width $D_2$ and height $H_2$ above the ground shield 108 (ground plane) are influential factors in determining the delay. The intermediate metal of the intermediate signal line 112 interacts with the metal ground shield 108 and capacitance between intermediate line 112 and ground shield 108 is constant in use.

Figure 3:
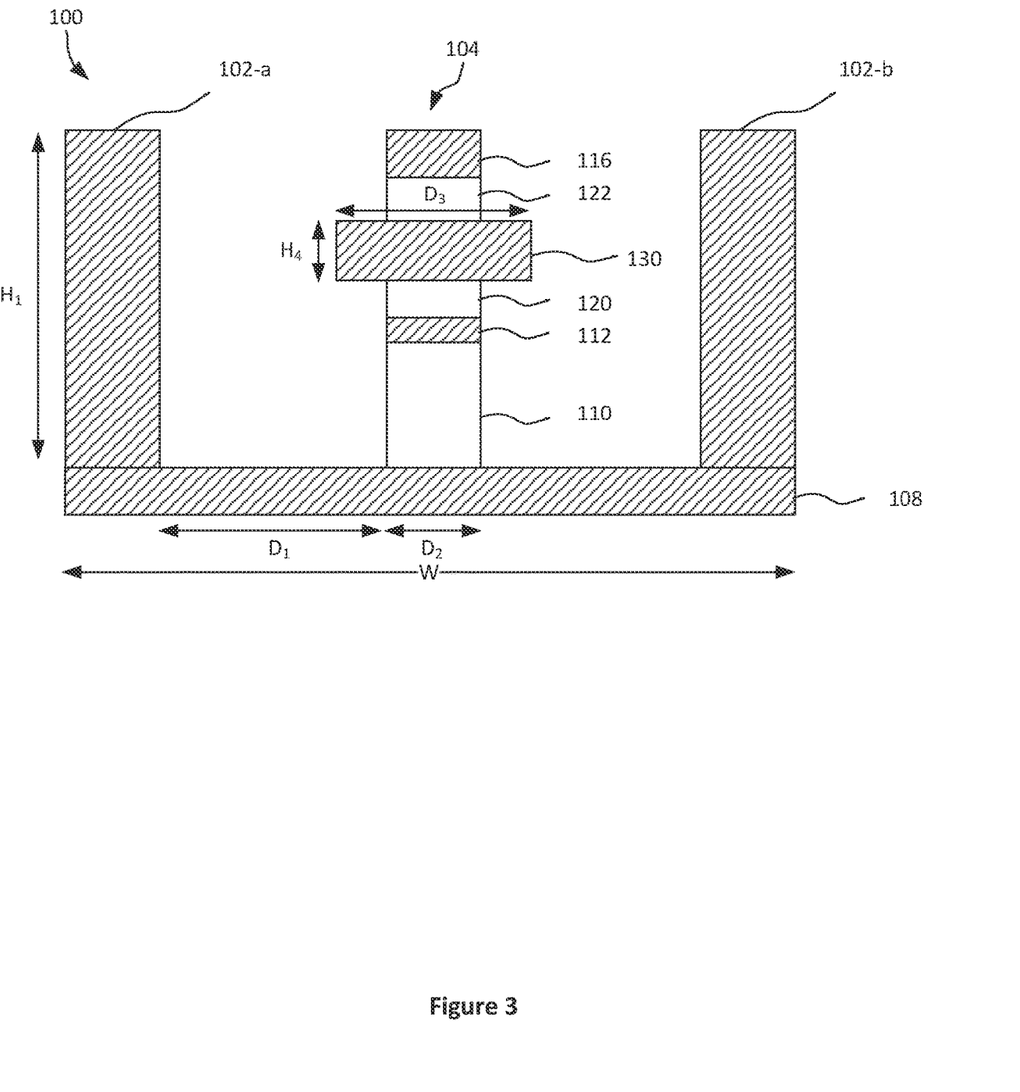
FIGS. 3 and 4 illustrate a cross-sectional view of a phase shifter comprising one or more blocks according to an embodiment of the disclosure.
Figure 4:
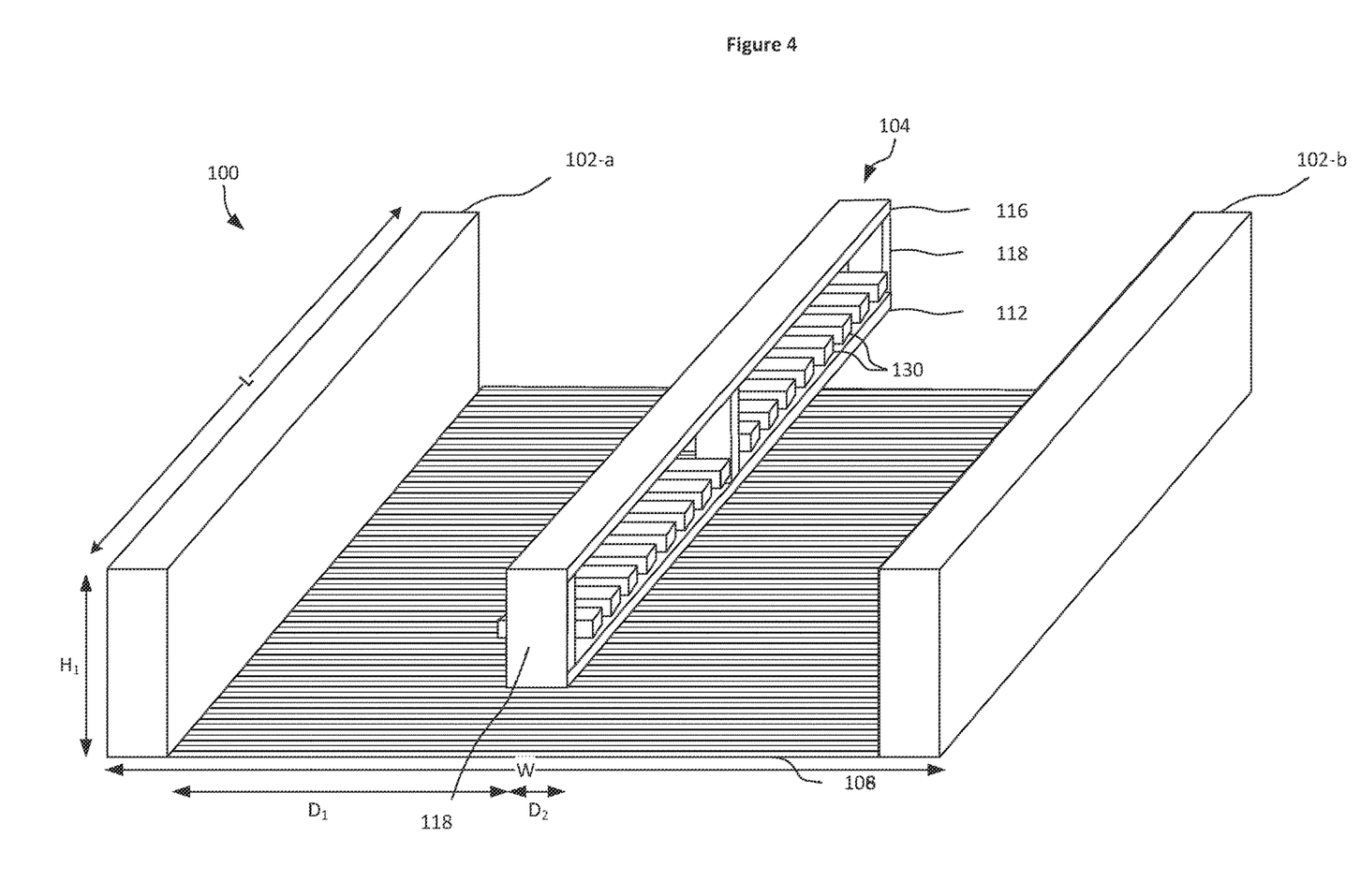

Further improvements to the phase shifting capabilities of a phase shifter 100 are described below in relation to FIGS. 3 and 4 which illustrate a cross-sectional view of a phase shifter 100 comprising one or more blocks 130. FIGS. 3 and 4 will be described in combination below. A block 130 is inserted between the intermediate and top signal lines 112, 116 of FIG. 1A between the vias 118.

Digital phase shifters as described herein can discretise the absolute phase into predetermined phase states, changed by digitally controlling the device by addressing one or more of a plurality of blocks 130. To change the characteristic impedance of the transmission line, either the inductance or the capacitance can be changed. The tuneable transmission line of the described device exhibits variable characteristic impedance as a result of said blocks 130, where changing the capacitance can be achieved by adding one or more metal blocks 130 to the signal line 104 between the intermediate and top signal lines 112, 116.

The phase shifter 100 illustrated in FIGS. 3 and 4 is structurally the same as that described above in relation to FIGS. 1A, 1B and 2 but additionally comprises one or more metal blocks 130 between the intermediate and top signal lines 112, 116. The blocks 130 have a height $H_4$ which is less than the height between the top signal line 116 and the intermediate signal line 112. The block 130 has a width $D_3$ in a direction of the width W of the phase shifter 100, and a length $L_1$ in the direction of the length L. The width of a block $D_3$ is greater than that of the signal line $D_2$ such that a block 130 extends into a region between the signal line 104 and the ground walls 102-a, 102-b when it is placed between the intermediate signal line 112 and top signal line 116. In some embodiments, a block 130 is aligned with the centre of the signal line 104 such that it extends symmetrically into the region between the signal line 104 and ground lines 102-a, 102-b as illustrated in FIG. 3. In other embodiments, blocks 130 may not be centrally aligned such that they extend further into a first region between the signal line 104 and the first ground wall 102-a than it extends into a second region defined between the signal line 104 and the second ground wall 102-b. In yet further embodiments, the block may extend into either the first or second region and not the other region at all. In some embodiments, there may be a combination of different alignments of the blocks along the length L of the phase shifter 100. In some embodiments, a first set of eight blocks 130 may extend further into the first region than the second region and a second set of eight blocks may extend into the second region further than the first region. Blocks 130 extend into the first and second regions so that they can be connected to switches as discussed in more detail below in relation to FIGS. 5 to 8. In one embodiment, the extent to which a block extends into the regions may be at least equal to the sum of the vertical thickness of the dielectric layer 122, and top signal line 116. This can provide an optimal value of the lateral capacitance.

Blocks 130 are aligned along their long edge and in a straight line along the length L of the signal line 104 of the phase shifter 100. The blocks 130 extend the length L of the phase shifter 100 between the top signal line 116 and intermediate signal line 112 and the conductive vias 118. In some embodiments, sets of eight blocks comprising two sets of four blocks 130 are positioned between consecutive vias 118.

A first layer of dielectric material 120 separates a bottom surface of the block 130 from sitting directly on top of the intermediate signal line 112 and a second layer of dielectric material separates a top surface of the block 130 from the top signal line 116. This dielectric material acts to electrically isolate the blocks from the signal lines 112, 116. The separation of the blocks 130 from the signal lines 112, 116 is preferably kept to a minimum distance such that the block occupies a large proportion of the cross-sectional height $H_2$ without directly contacting the top signal line 116 or the intermediate signal line 112 such that it is electrically isolated from the signal line 104. Limitations on the separation distance between the block 130 on the signal lines may be determined by the manufacturing process. In some embodiments, the separation between a top surface of the blocks 130 and the top signal line 112 and a bottom surface of the block 130 and the intermediate signal line 116 is equal.

Blocks 130 are separated from each other along the length L of the phase shifter 100 by a distance $L_2$. Dielectric material separates the blocks 130 so that they are not in direct contact with each other. In some embodiments, distance $L_2$ is the same between each of the blocks along the length L of the phase shifter 100. In other embodiments, the distance $L_2$ may vary. In one embodiment, $L_2$ is a minimum distance such that the blocks are close together but not touching. In one embodiment, the separation between blocks 130 may be equal to the separation between a top surface of the blocks 130 and the top signal line 112 and a bottom surface of the block 130 and the intermediate signal line 116. Spacing between adjacent blocks 130 and between blocks 130 and the intermediate and top signal lines 112, 116 is designed to create an optimised capacitive coupling. This capacitive coupling induced between the blocks 130 and the intermediate and top signal lines 112, 116 changes the capacitance to tune the impedance and hence phase shift of the device.

In some embodiments, the blocks of the phase shifter 100 are identical to one another. In other embodiments, the blocks can vary, for example in size or shape. Preferably, the blocks are a rectangular parallelepiped shape, however, they are not so limited. The size of the blocks 130 can be changed to achieve different results and tune the phase shifting capabilities of the phase shifter 100 accordingly.

The blocks 130 act to change the phase of the signal which propagates along the signal line 104 in operation. Phase signal can be tuned by changing the number of blocks 130 and thereby the capacitance. As blocks 130 are added, the capacitance is adjusted. Therefore, the greater the number of blocks 130, the greater the phase shift of the signal. Impedance is dependent on inductance and capacitance. By adjusting the capacitance using the blocks 130, impedance can therefore be tuned. To be able to finely tune the phase shifting, blocks 130 can be added or removed from the design as appropriate or as required. The shape and size of the blocks 130 can also be tuned to determine the intervals of phase shift available to the phase shifting device 100.

The present disclosure further provides a phase shift device that can minimise losses. Losses can be reduced for example by minimising a number of switches used to couple blocks 130 with the ground shield 108. Switches can activate and deactivate blocks from participating in contributing to phase shift of the signal along the length L of the device 100. To achieve a flexible phase shift device capable of small interval changes to the phase shift, a number of switches are required in order to accurately control which elements of the device contribute to phase shifting. Whilst offering high levels of control, devices capable of fine intervals of phase shift can result in large numbers of switches being required, which can adversely affect losses where higher numbers of switches present in devices result in higher losses. There is therefore a need for a device which achieves desired phase shift value per area and minimises losses.

Figure 5:
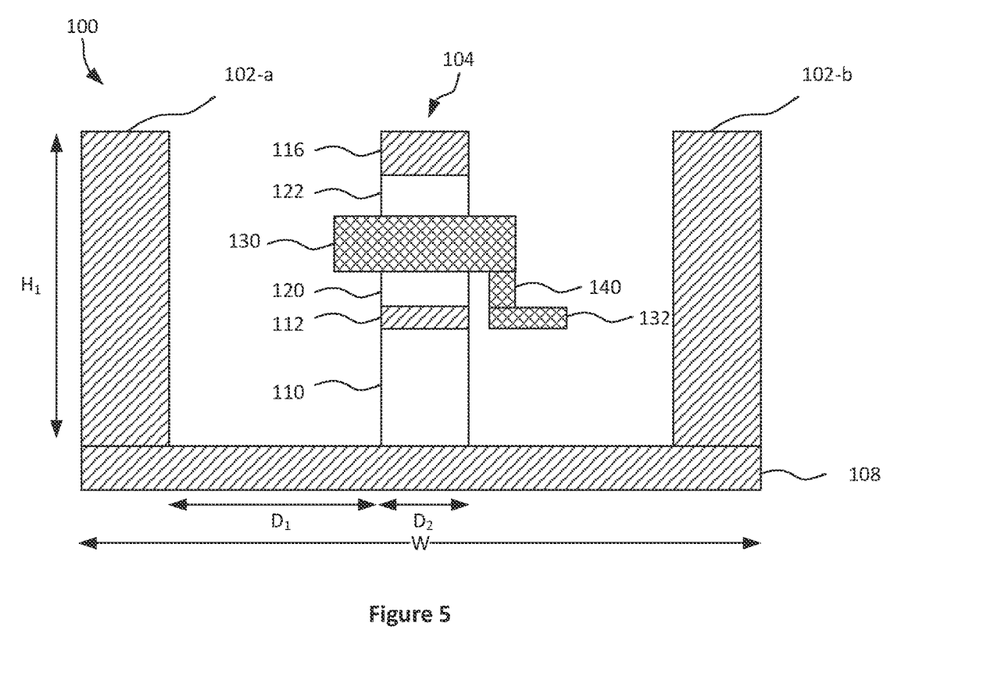
FIG. 5 illustrates a cross-sectional view of the phase shifter comprising a switch according to an embodiment of the disclosure.
Figure 6:
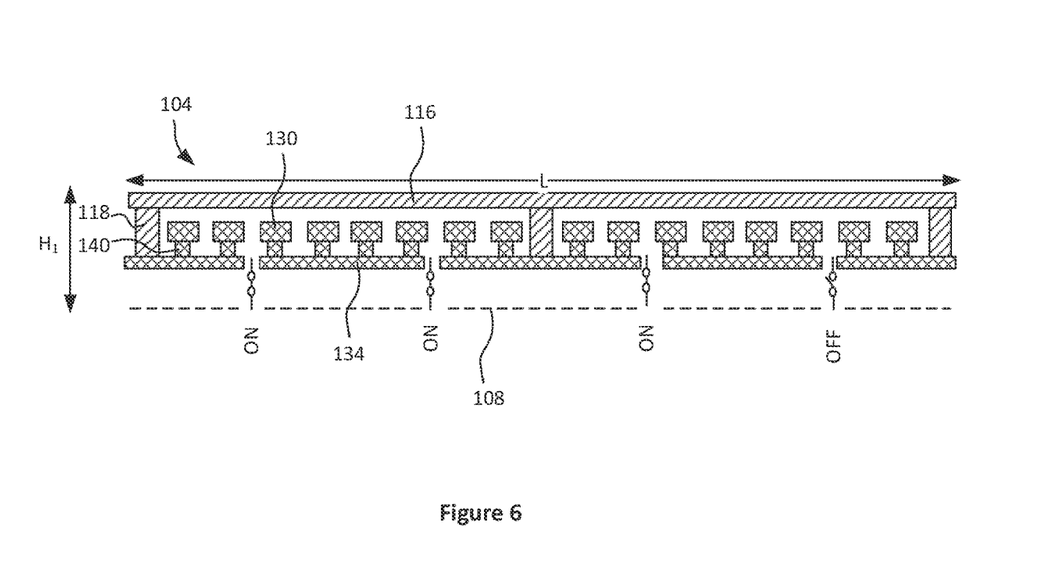
FIG. 6 illustrates a different cross-sectional view of the phase shifter comprising a plurality of blocks connected to a plurality of switches according to an embodiment of the disclosure.
Figure 7:
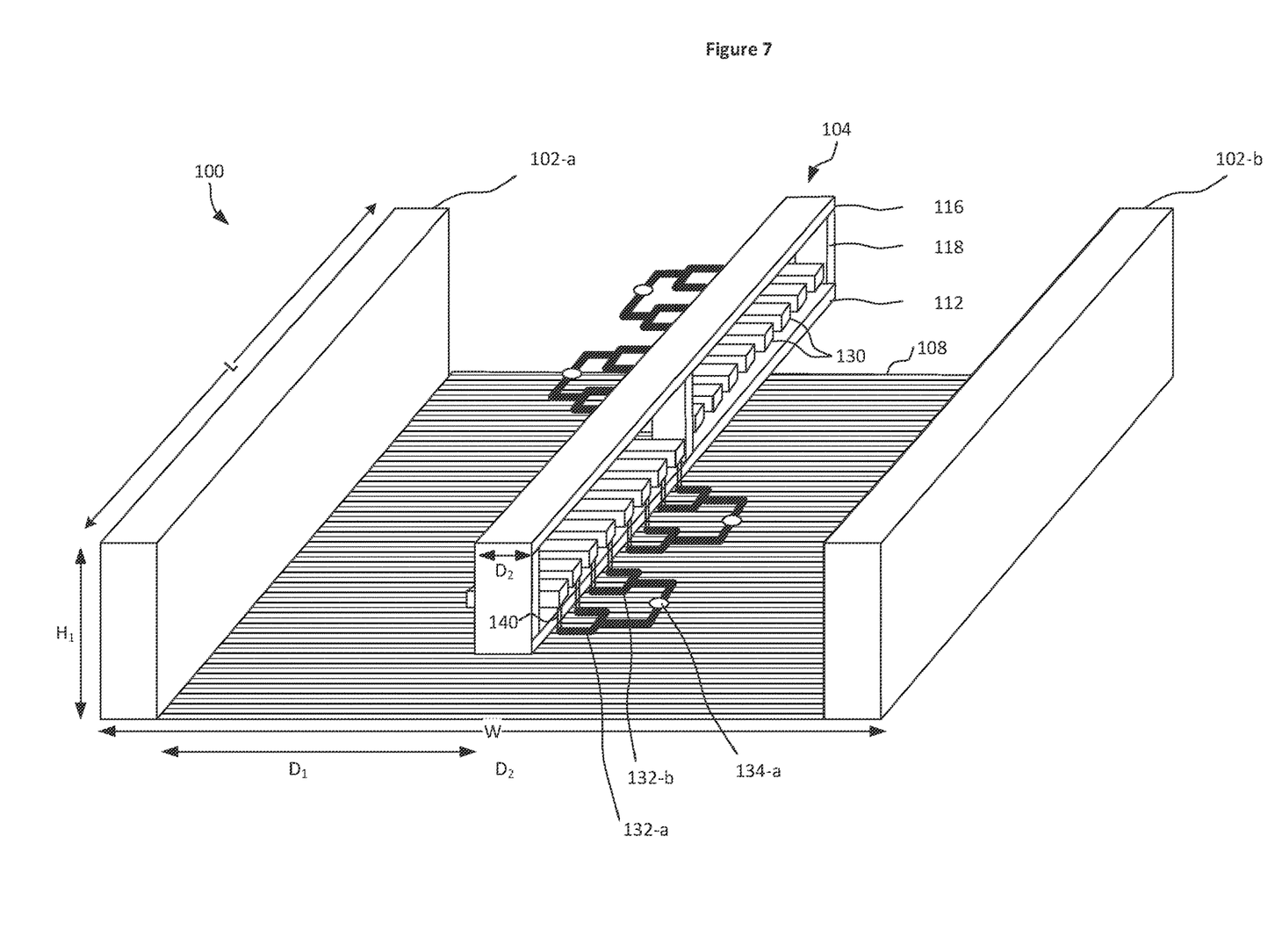
FIG. 7 illustrates a perspective view of the phase shifter comprising a plurality of switches according to an embodiment of the disclosure.
Figure 8:
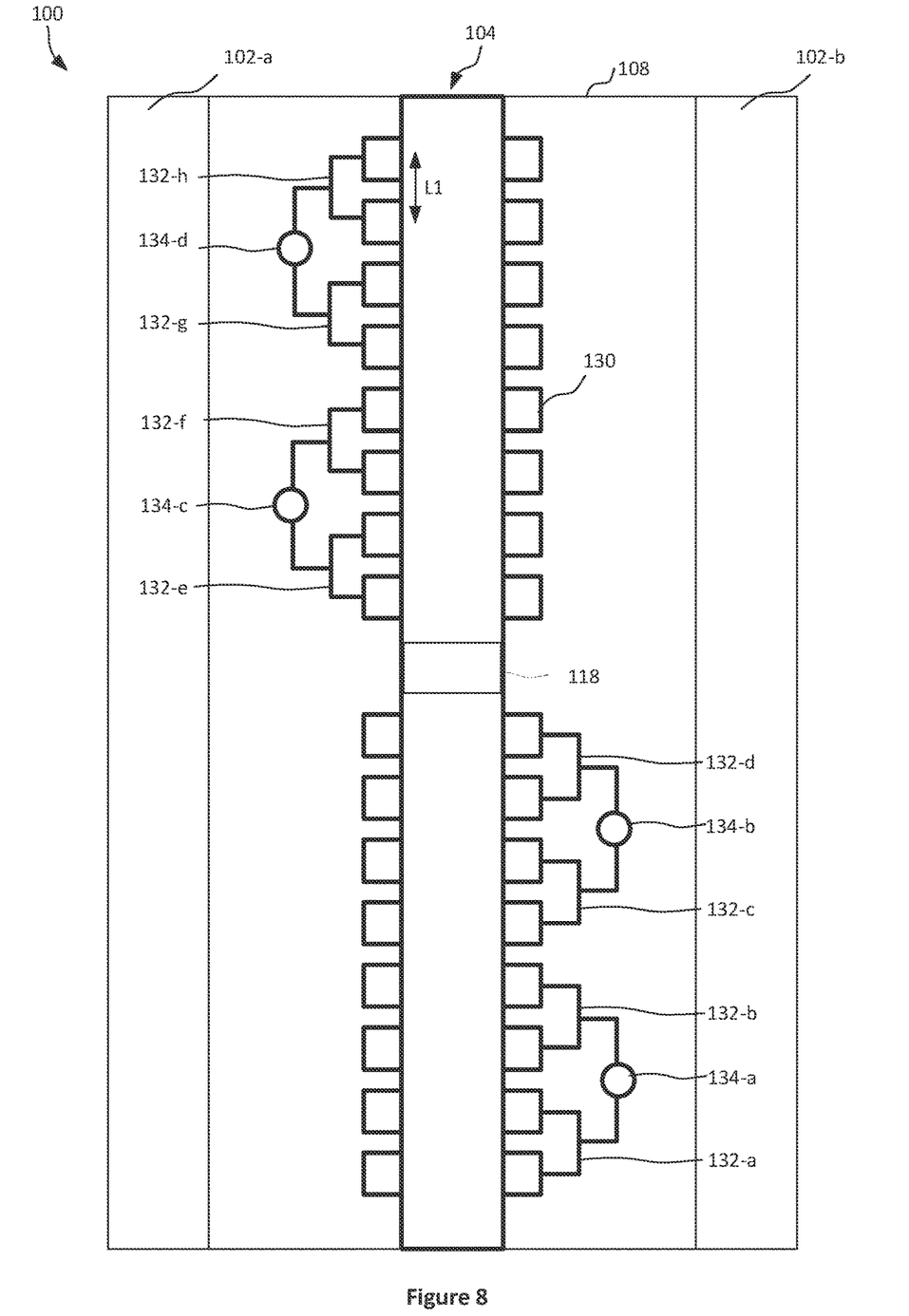
FIG. 8 illustrates a plan view of the phase shifter comprising a plurality of switches according to an embodiment of the disclosure.

FIG. 5 illustrates a cross-sectional view of the phase shifter 100 comprising a switch. For illustrating purposes only the block 130, via 140 and metal strip 132 are shaded differently to other metal components of the device 100. It will be understood that these components are made from the same metal as the other components of the device. FIG. 6 illustrates a different cross-sectional view of the phase shifter 100 orthogonal to the view of FIG. 5 along the length L of the device 100 and comprising a plurality of blocks 130 connected to a plurality of switches 134. As in FIG. 5, the blocks 130, vias 140 and switches 134 are shaded differently to the other components of the device 100 for ease of reference only. FIG. 7 illustrates a perspective view of the phase shifter 100 further comprising a plurality of switches 134 and FIG. 8 illustrates a plan view of the phase shifter 100 further comprising a plurality of switches. FIGS. 5, 6, 7 and 8 will be described together below.

The phase shifter device 100 is structurally the same as that described above in relation to FIGS. 3 and 4 above, further comprising blocks 130 being connected to one or more switches 134.

As illustrated in FIGS. 7 and 8, a first connector 132-a comprising a metal strip and a via 140 couples a first block 130 to an adjacent second block 130 in a first pair. Each block 130 comprises a respective via 140 extending from said block 130 to the metal strip of the connector 132 to be connected to another, adjacent block. A second metal strip connector 132-*b* couples adjacent third and fourth blocks 130 in a second pair wherein the third block 130 is adjacent to the second block 130. A length of the connectors 132-*a*, 132-*b* is preferably constant, determined by the size and spacings of the blocks 130. In some embodiments, the connectors 132-*a*, 132-*b* connecting the blocks 130 is as short as can be achieved given design and manufacturing constraints. Minimising these lengths helps to reduce losses in operation.

A further coupling connection is made between the first and second pairs of blocks 130 connected by connectors 132-*a*, 132-*b*. Said further coupling connection comprises a first switch 134-*a*. Similarly, to the connectors 132-*a*, 132-*b*, the coupling connection of the switch 134-*a* is also preferably constant and as short as can be achieved given design and manufacturing constraints. In some embodiments, the switch 134 may be a MOS switch. In other embodiments, the switch 134 may be a PIN diode. Other types of switch may be suitable. The same type of switch 134 is preferably maintained across a single device for ease of manufacturing and design.

A first coupled group of four blocks 130 connected to a first switch 134-*a* by connectors 132-*a*, 132-*b* and vias 140 may be described as a group in a first pattern. A device 100 as illustrated in FIGS. 7 and 8 may comprise four coupled groups of four blocks in four patterns. A configuration of four blocks 130 connected by one switch 134 provides a balance between control over phase shift of the signal and minimising losses by minimising the number of switches 134. Increased numbers of coupled blocks 130 greater than four coupled together can further reduce the number of switches 134, however, due to the additional components required, losses may be increased, and the phase shifting capabilities of the device may not have such fine control.

As illustrated for example in FIG. 8, a first two switches 134-*a* and 134-*b* can be located in a first region between the central signal line 104 and one of the pair ground walls 102-*b*, whilst a further second two switches 134-*c*, 134-*d* can be located in a second region between the central signal line 104 and a second one of the pair of ground walls 102-*a*. It will be appreciated that other configurations are possible such as alternating patterns of four connected blocks located in alternate regions compared to pairs of patterns being located on alternate regions. The design pattern as illustrated in FIGS. 7 and 8, where blocks 130 are connected by switches 134 located on both sides of the signal path 140 in an ordered manner also helps to ensure that there are no return paths of the signal through the signal line 104. Return paths through the signal line 104 are broken by the design such that the return paths travel through the ground walls 102-*a*, 102-*b*. This improves performance of the phase shifter device 100.

The connectors 132-*a*, 132-*b* and switch 134-*a* are positioned at height $H_2$ above the ground shield 108, i.e. at the same as the height as the intermediate signal line 112. This is illustrated in FIGS. 5 and 6. The metal for the connectors 132, switches 134 and intermediate line 112 can therefore be deposited in a same layer, for example at the same time.

The connectors 132-*a*, 132-*b* and switch 134-*a* are deposited as metal strips at the same metallisation level as the intermediate signal line 112. Conductive vias 140 connect the blocks 130 to the connectors 132 and switches 134. For ease of reference, the blocks 130, vias 140, connectors 132 and switches 134 in FIGS. 5 and 6 are shaded differently to the ground shield 108 and ground walls 102-*a*, 102-*b*, however, it will be appreciated that this is for demonstration only. In practice, the metals used to make up the components of the device will be the same at each metallisation level and across the device.

Coupling connections which are minimised, i.e. short connections between adjacent blocks, have been shown to beneficially reduce losses in operation. By connecting blocks 130 in a configuration comprising groups of four blocks 130 (two pairs of connected blocks connected by a switch 134) as illustrated in FIGS. 6, 7 and 8 the number of switches present in the phase shifter 100 can be minimised, whilst control of the phase shift can be tuned by turning blocks 130 on or off to contribute to the phase shift of the signal. Minimising the number of switches is desirable to further avoid losses in the signal.

Switches can be in an on state 134-1 or an off state 134-2. When a switch is in an on state 134-1, the blocks 130 which are connected by a switch 134 are communicatively coupled to the ground shield 108. In an off state 134-2, connected blocks 130 are isolated from the ground shield 108. Blocks are activated in this way along the length L of the phase shifter device 100. In one embodiment, blocks may be consecutively switched on one by one up to a final block 130 *n* of the plurality of blocks which may be the last block n of the plurality of blocks. For example, a first block 130 of the line of plurality of n blocks may be switched on first, followed by a second block of the line of plurality of n blocks which is adjacent to the first block, and so on. This advantageously may help to provide a good matching and can help to avoid mode updates along the signal line 104. In an alternative embodiment, blocks may be turned on in a different arrangement. For example, a first block 130 may be switched on, followed by a final block n 130, followed by a second block (which is a block adjacent the first block), followed by a penultimate block 130 *n*−1, and so on until all the blocks 130 have been activated.

Blocks 130 are turned on in operation by switches 134-*a*, 134-*b*, 134-*c*, 134-*d* and act to shift the phase of the signal. When coupled to the ground by a switch 134-*a*, 134-*b*, 134-*c*, 134-*d*, the blocks 130 participate to the changing of the phase of the signal as it travels along the line. Depending on the number of blocks, the amount the phase of the signal is shifted changes. By selecting the blocks to be turned on or off using the switches 134-*a*, 134-*b*, 134-*c*, 134-*d* the phase shift can be tuned accordingly. The more blocks that are switched on, the greater the phase shift. Phase shift of the signal up to 200 degrees has been achieved with the described embodiments.

Whilst minimising the total number of switches 134-*a*, 134-*b*, 134-*c*, 134-*d* present in the phase shifter 100 is desirable, this is balanced with the desire to control the amount by which the signal can be phase shifted, which can be tuned by selectively switching blocks 130 on and off. Connecting blocks of four together has been shown to provide a suitable balance between desired control or range of control over phase shift of the signal and reduction of losses through reduced number of switches 134-*a*, 134-*b*, 134-*c*, 134-*d*.

The phase shifter 100 as illustrated in FIG. 1A to FIG. 8 can be manufactured using a metallisation process. In metallisation, layers of metal and dielectric are sequentially deposited, the structure is built up from the bottom layer comprising the ground shield 108. Patterning the layers can be achieved through lithography, using any standard appropriate lithography techniques. Patterning of dielectric layers can be used to determine areas where metal is deposited, thereby enabling complex three-dimensional structures to be constructed. For ease of understanding, layers 110 and 114 of FIGS. 1A and 1B are illustrated as having a width equal to that of the metal layer $D_2$ comprising the top and intermediate signal lines 116, 114 respectively. However, it will be appreciated that in practice due to the manufacturing process, the dielectric material will also fill the space between the signal line 104 and the metal stacks 102-*a*, 102-*b* with height $H_1$ and width $D_1$.

Figure 9:
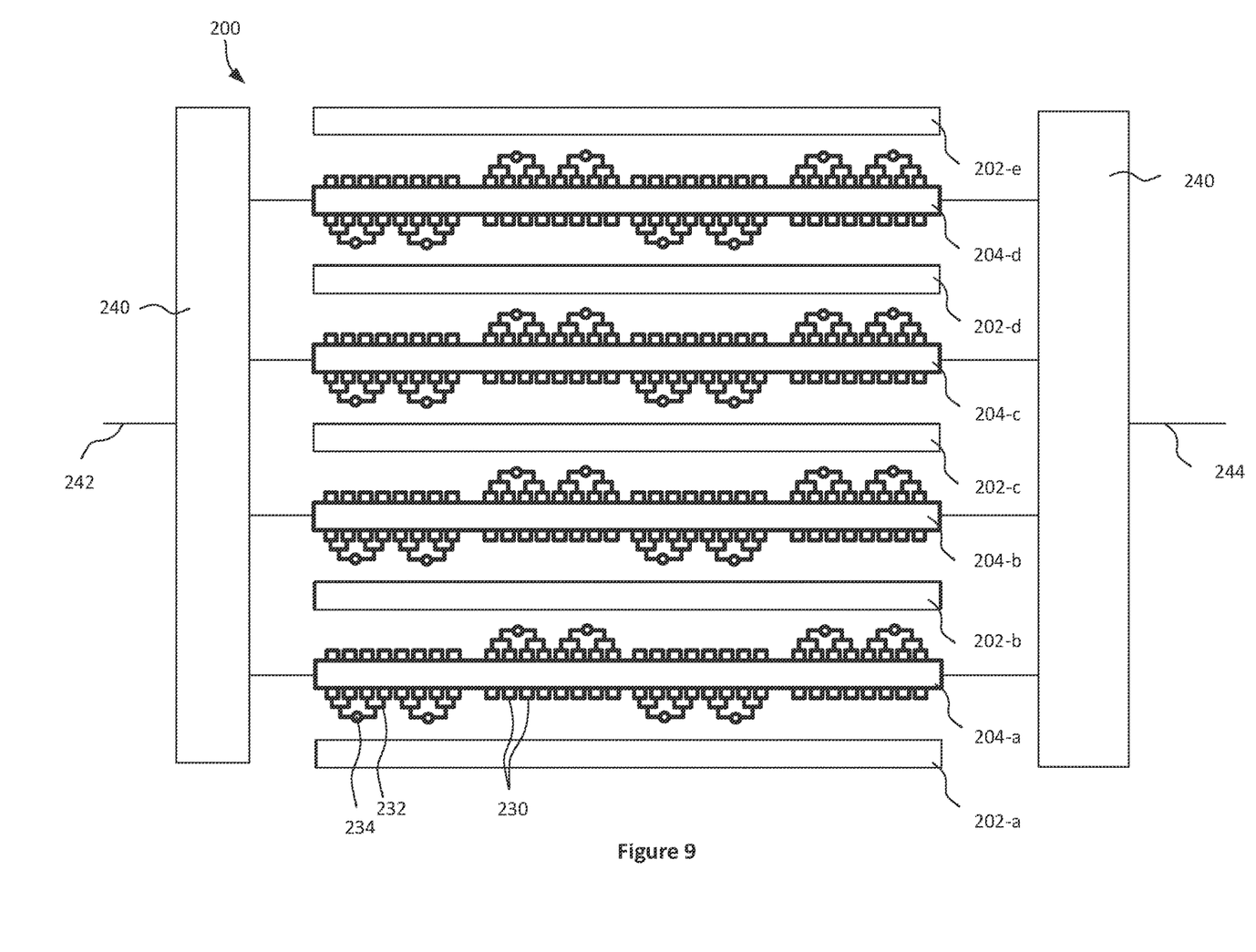
FIG. 9 illustrates a plan view of an alternative embodiment of a phase shifter.

Other methods of manufacture as possible, such as on a printed circuit board, PCB. FIG. 9 illustrates a plan view of an alternative embodiment of a phase shifter 200. A plurality of ground walls 202-*a*, 202-*b*, 202-*c*, 202-*d*, 202-*e* alternate with a plurality of signal lines 204-*a*, 204-*b*, 204-*c*, 204-*d*. Such that a first signal line 204-*a* is surrounded on either side by a pair of ground walls 202-*a* 202-*b*, and ground wall 202-*b* forms one of a pair of a second pair of ground walls 202-*b*, 202-*c* which surround a second signal line 204-*b* and so on. It will be appreciated that this structure can be repeated any number of times, as long as the edges of the phase shifter are ground walls 202-*a*, 202-*e*.

Signal lines 204-*a*, 204-*b*, 204-*c*, 204-*d* comprise the features described in relation to the previous FIGS. 1 to 8. However, the connection 234 is not a switch in this embodiment. Instead, connection 234 is a hard connection. Switching is instead controlled by switches 240 located at either end of the phase shifter 200. As such, all the blocks 230 in a one of the plurality of signal lines 204-*a*, 204-*b*, 204-*c*, 204-*d* can be turned on or off at once to determine a phase change.

The plurality of signal lines 204-*a*, 204-*b*, 204-*c*, 204-*d* are connected to switches 240. In some embodiments, the switches are SPD4T switches. The switches are connected to an input 242 and an output 244. The phase shift of the signal can be tuned by selectively switching signal lines 204-*a*, 204-*b*, 204-*c*, 204-*d*, where more signal lines being switched on creates a greater phase shift of the signal and vice versa.

Figure 10:
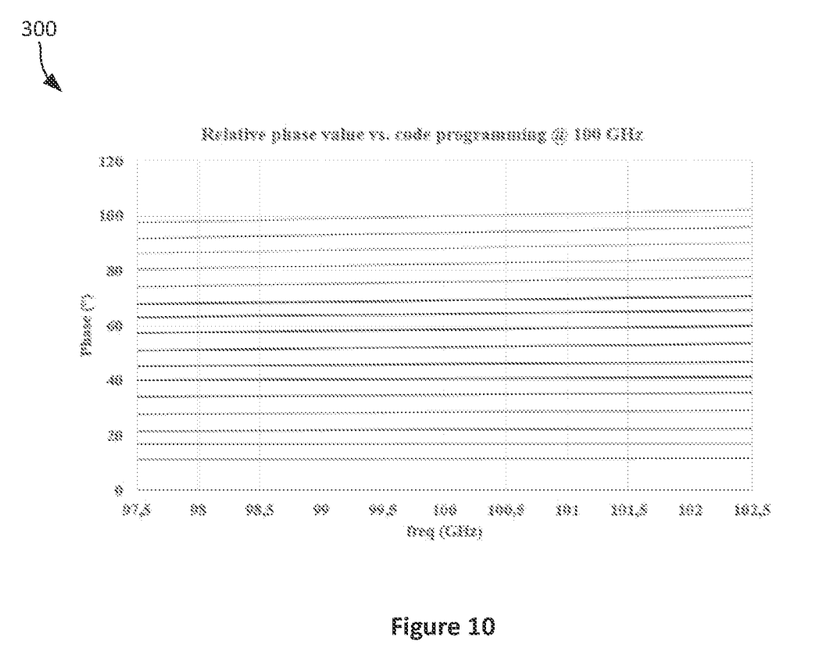
FIGS. 10 and 11 illustrate a graph showing relative phase value against code programming at 100 GHz and 60 GHz respectively.
Figure 11:
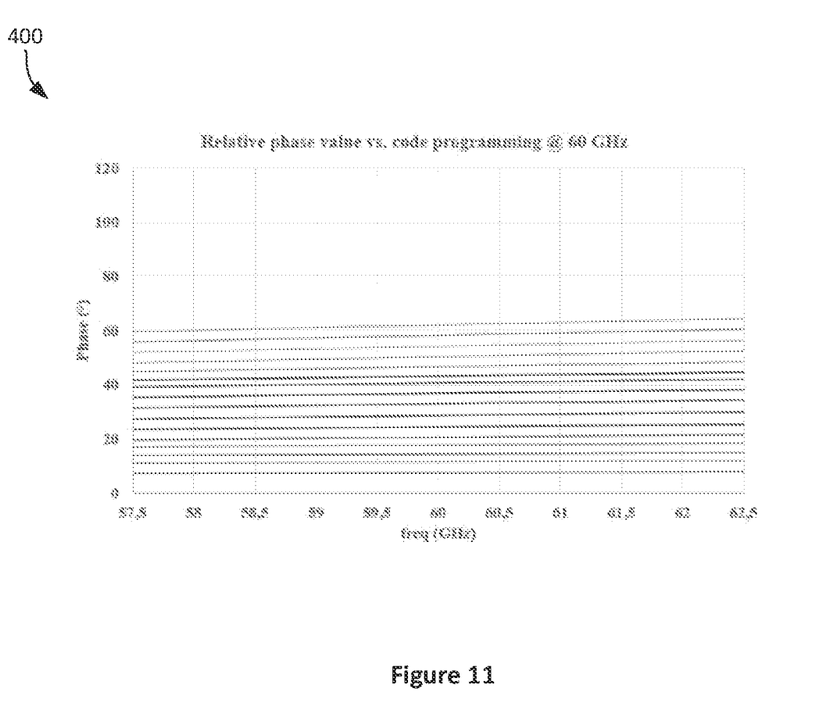

FIGS. 10 and 11 illustrates a graph showing relative phase value against code programming at 100 GHz and 60 GHz respectively. Frequency measured in GHz is plotted along the x-axis and phase shift in degrees is plotted on the y-axis. Using a phase shifter comprising four patterns of four blocks connected by a single switch as illustrated in FIGS. 7 and 8 (i.e. a total of 16 blocks), the phase shift was measured at frequencies ranging from 97.5 GHz to 102.5 Hz (FIG. 10) and between 57.7 GHz and 62.5 GHz (FIG. 11). The phase shift was measured at each frequency with increasing numbers of blocks switched on to contribute to the phase shift of the signal. The lowermost line of the graph represents the relative phase shift achieved with the fewest number of blocks contributing to the capacitance of the signal line 104 (i.e. one block 130 activated) and the highest line of the graph represents the relative phase shift achieved with the greatest number of blocks (i.e. 16 blocks 130 activated). As blocks 130 are switched on one-by-one, this gave a resulting 16 measurements at each frequency with a 16 block design. As can be seen from FIG. 10, an overall phase shift of 100 degrees at 100 GHz was achieved when all of the blocks 130 were switched on and contributing to the phase shift of the signal. It can be seen from FIGS. 10 and 11 that the phase shift increases in a linear manner as more blocks are added.

Figure 12:
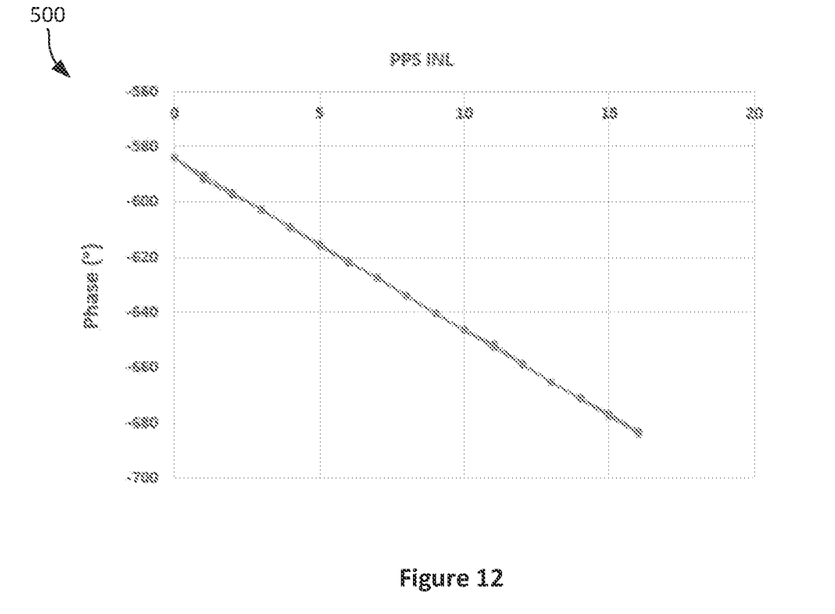
FIG. 12 illustrate a graph of the Phase INL of the system according to an embodiment of the disclosure.
Figure 13:
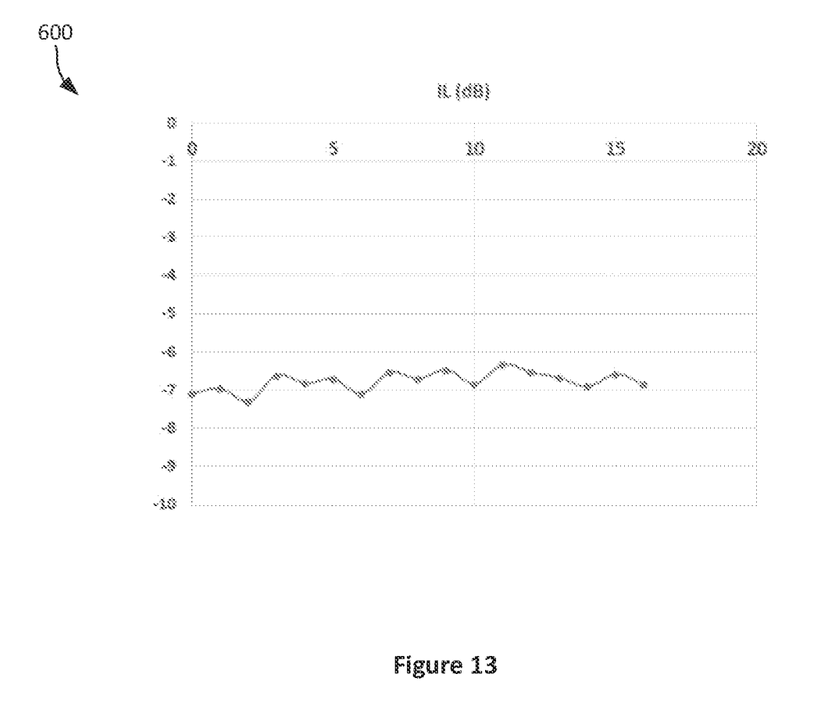
FIG. 13 illustrates a graph of the P2G of the system according to an embodiment of the disclosure.

From the data in FIGS. 10 and 11, the Phase Integral Non Linearity (INL) and phase to gain (P2G) of the system can also be deduced. FIGS. 12 and 13 illustrate the Phase INL and P2G respectively. Integral nonlinearity is a commonly used measure of performance in digital-to-analog (DAC) converters. In DACs, it is a measure of the deviation between the ideal output value and the actual measured output value for a certain input code. The ideal transfer function of a DAC is a straight line. As illustrated in FIG. 12, the line is straight, showing that the transfer function is good. The obtained Phase INL measured 1.7 degrees with a 0.7 degrees root mean square and the P2G exhibited a 1 dB peak-to-peak variation. At 100 GHz, losses average 6.8 dB for a 100-degree phase shift and 3.1 dB for a 45 degree phase shift. Overall, the losses average 15 degrees per dB with the design as described herein.

Figure 14:
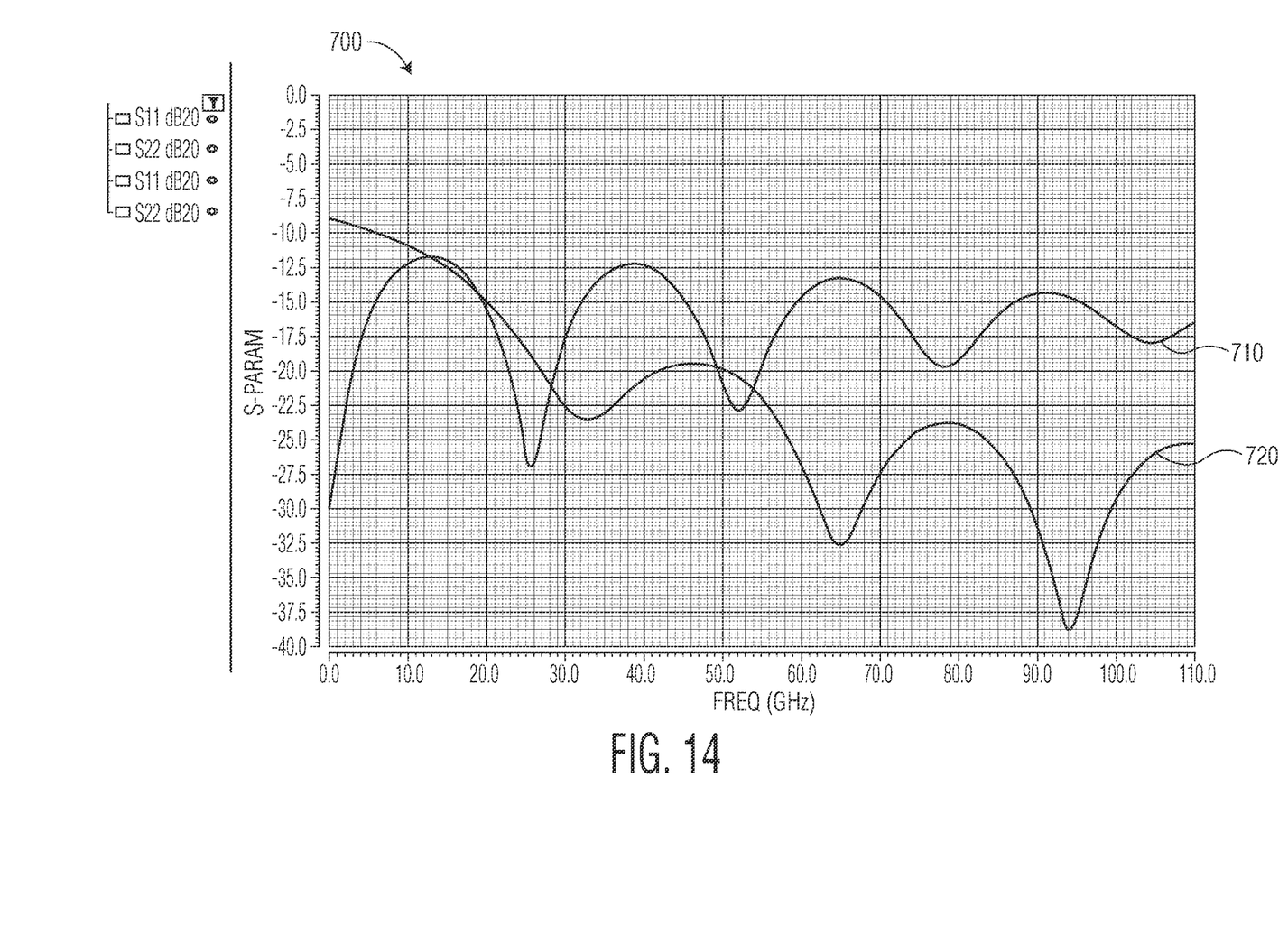
FIG. 14 illustrates a graph showing return losses simulated on the whole system.

FIG. 14 illustrates return losses simulated on the whole system. The x-axis shows the scattering parameter (S-parameter) and the y-axis shows frequency (GHz). The scattering parameter describes the electrical behaviour of linear electrical networks when undergoing various steady state stimuli by electrical signals. Line 720 shows the minimum phase shift when all the switches are off and line 710 shows the maximum phase shift when all the switches are on. As illustrated in FIG. 14, the electrical length of lines 710 and 720 is clearly different and thus the difference in phase shift can be clearly seen.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

Accordingly, there has been described a passive phase shifter comprising a ground shield, a pair of ground walls electrically connected to the ground shield having a first height above the ground shield; and a signal line positioned between the ground walls and electrically isolated from the ground shield. The signal line may comprise an intermediate signal line separated a second height above the ground shield; a top signal line separated from the intermediate signal line at a third height above the ground shield and electrically connected to the intermediate signal line by one or more conductive vias; and a plurality of blocks positioned between and electrically isolated from the intermediate signal line and the top signal line.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

The invention claimed is:

1. A passive phase shifter comprising:
a ground shield;
a pair of ground walls electrically connected to the ground shield, the ground walls having a first height above the ground shield; and
a signal line positioned between the ground walls and electrically isolated from the ground shield, the signal line comprising;
an intermediate signal line separated a second height above the ground shield;
a top signal line separated from the intermediate signal line at a third height above the ground shield and electrically connected to the intermediate signal line by one or more conductive vias; and
a plurality of metal blocks positioned between and electrically isolated from the intermediate signal line and the top signal line;
wherein the ground shield comprises a plurality of elongate slots extending perpendicular to a longitudinal axis of the signal line; and
a first and a second metal block of the plurality of metal blocks are electrically coupled in a first pair; and
the first pair of metal blocks and a second pair of metal blocks are electrically connected to a first switch, the second pair of metal blocks comprising a third metal block and a fourth metal block of the plurality of metal blocks.

2. The passive phase shifter of claim 1 wherein the first metal block is adjacent to the second metal block.

3. The passive phase shifter of claim 1 wherein the third metal block is adjacent to the fourth metal block.

4. The passive phase shifter of claim 1 wherein the first pair of metal blocks is adjacent to the second pair of metal blocks.

5. The passive phase shifter of claim 1 wherein the first and second pairs of metal blocks are coupled to the ground shield when the first switch is on.

6. The passive phase shifter of claim 1 wherein the first switch is positioned between the signal line and a first one of the pair of ground walls at the second height.

7. The passive phase shifter of claim 1 further comprising a third pair of metal blocks and fourth pair of metal blocks electrically connected to a second switch, the second switch positioned between the signal line and a second one of the pair of ground walls at the second height.

8. The passive phase shifter of claim 1, further comprising one or more additional passive phase shifters connected in parallel.

9. The passive phase shifter of claim 8 further comprising switches for controlling the plurality of phase shifters, wherein the switches are connected to ends of the signal lines.

10. The passive phase shifter of claim 1 wherein adjacent metal blocks in the plurality of metal blocks are spaced apart from one another by a first distance.

11. The passive phase shifter of claim 1 wherein the plurality of metal blocks are arranged in a linear array along a longitudinal axis of the signal line.

12. A method of manufacturing a passive phase shifter according to claim 1 using a metallisation process comprising:
forming a ground shield;
forming a pair of ground walls electrically connected to the ground shield, the ground walls having a first height above the ground shield; and
forming a signal line positioned between the ground walls and electrically isolated from the ground shield, the signal line comprising;
an intermediate signal line separated a second height above the ground shield;
a top signal line separated from the intermediate signal line at a third height above the ground shield and electrically connected to the intermediate signal line by one or more conductive vias; and
a plurality of metal blocks positioned between and isolated from the intermediate signal line and the top signal line;
wherein forming the ground shield comprises forming a plurality of elongate slots extending perpendicular to a longitudinal axis of the signal line;
wherein a first and a second metal block of the plurality of metal blocks are electrically coupled in a first pair; and
wherein the first pair of metal blocks and a second pair of metal blocks are electrically connected to a first switch, the second pair of metal blocks comprising a third metal block and a fourth metal block of the plurality of metal blocks.

13. The passive phase shifter of claim 2 wherein the third metal block is adjacent to the fourth metal block.

14. The passive phase shifter of claim 2 wherein the first pair of metal blocks is adjacent to the second pair of metal blocks.

15. The passive phase shifter of claim 2 wherein the first and second pairs of metal blocks are coupled to the ground shield when the first switch is on.

16. The passive phase shifter of claim 2 wherein the first switch is positioned between the signal line and a first one of the pair of ground walls at the second height.

17. The passive phase shifter of claim 2 further comprising a third pair of metal blocks and fourth pair of metal blocks electrically connected to a second switch, the second switch positioned between the signal line and a second one of the pair of ground walls at the second height.

18. The passive phase shifter of claim 2, further comprising one or more additional passive phase shifters connected in parallel.

19. The passive phase shifter of claim 2 wherein adjacent metal blocks in the plurality of metal blocks are spaced apart from one another by a first distance.

20. The passive phase shifter of claim 2 wherein the plurality of metal blocks are arranged in a linear array along a longitudinal axis of the signal line.

* * * * *